(12) United States Patent
Lee et al.

(10) Patent No.: US 7,777,345 B2
(45) Date of Patent: Aug. 17, 2010

(54) SEMICONDUCTOR DEVICE HAVING THROUGH ELECTRODE AND METHOD OF FABRICATING THE SAME

(75) Inventors: Ho-Jin Lee, Seoul (KR); Nam-Seog Kim, Gyeonggi-do (KR); Yong-Chai Kwon, Gyeonggi-do (KR); Hyun-Soo Chung, Gyeonggi-do (KR); In-Young Lee, Gyeonggi-do (KR); Son-Kwan Hwang, Gyeonggi-do (KR)

(73) Assignee: Samsung Electronics Co., Ltd., Yeongtong-gu, Suwon-si Gyeonggi-do (KR)

( * ) Notice: Subject to any disclaimer, the term of this patent is extended or adjusted under 35 U.S.C. 154(b) by 248 days.

(21) Appl. No.: 12/132,925

(22) Filed: Jun. 4, 2008

(65) Prior Publication Data

US 2009/0008790 A1    Jan. 8, 2009

(30) Foreign Application Priority Data

Jul. 2, 2007    (KR)    ...................... 10-2007-0066168

(51) Int. Cl.
   *H01L 23/48*    (2006.01)
(52) U.S. Cl. ........................ 257/774; 257/678; 257/686; 257/692; 257/734; 257/758
(58) Field of Classification Search .................. 257/699; 438/676, 773
   See application file for complete search history.

(56) References Cited

U.S. PATENT DOCUMENTS

2008/0258283 A1*    10/2008    Shimoto et al. ............. 257/678

FOREIGN PATENT DOCUMENTS

| JP | 10-041425 | 2/1998 |
| JP | 2003-332426 | 11/2003 |
| JP | 2004-296895 | 10/2004 |
| JP | 2006-128352 | 5/2006 |
| JP | 2007-067211 | 3/2007 |

OTHER PUBLICATIONS

English language abstract of Japanese Publication No. 10-041425.
English language abstract of Japanese Publication No. 2004-296895.
English language abstract of Korean Publication No. 2007-067211.

* cited by examiner

*Primary Examiner*—N Drew Richards
*Assistant Examiner*—Kyoung Lee
(74) *Attorney, Agent, or Firm*—Muir Patent Consulting, PLLC (57) ABSTRACT

A semiconductor device having a through electrode and a method of fabricating the same are disclosed. In one embodiment, a semiconductor device includes a first insulating layer formed on a semiconductor substrate. A wiring layer having a first aperture to expose a portion of the first insulating layer is formed on the first insulating layer. A second insulating layer is formed on an upper portion of the wiring layer and in the first aperture. A conductive pad having a second aperture to expose a portion of the second insulating layer is formed on the second insulating layer. A through hole with a width narrower than widths of the first and second apertures is formed through the first and second insulating layers and an upper portion of the semiconductor substrate. A through electrode is formed in the through hole.

12 Claims, 11 Drawing Sheets

SEMICONDUCTOR DEVICE HAVING THROUGH ELECTRODE AND METHOD OF FABRICATING THE SAME

CROSS-REFERENCE TO RELATED PATENT APPLICATION

This application claims the benefit of foreign priority to Korean Patent Application No. 10-2007-0066168, filed on Jul. 2, 2007, the disclosure of which is incorporated herein in its entirety by reference.

BACKGROUND

1. Field of Invention

Embodiments of the present invention relate to semiconductor devices and methods of fabricating the same, and more particularly, to a semiconductor device having a through electrode and a method of fabricating the same.

2. Description of the Related Art

Recently, the trend in semiconductor packaging, as well as in general consumer electronics, is for products to be as small and light as possible. Conforming to this trend, a chip stack package (CSP) having multiple semiconductor chips vertically stacked has been developed. The CSP is more favorable in terms of size and weight reduction than a package having multiple vertically stacked semiconductor packages. A semiconductor chip used in such a CSP has pad electrodes formed on its top and bottom surfaces. A through electrode penetrating the semiconductor chip is formed to connect the pad electrodes together.

SUMMARY

Embodiments of the present invention can be generally characterized as providing a semiconductor device capable of eliminating a manufacturing defect generated while forming a through electrode, and a method of fabricating the same.

One embodiment exemplarily described herein can be generally characterized as a semiconductor device. The semiconductor device may include a semiconductor substrate. A first insulating layer is disposed on the semiconductor substrate. On the first insulating layer, a wiring layer having a first aperture exposing a portion of the first insulating layer is formed. A second insulating layer is placed on an upper portion of the wiring layer and in the first aperture. A conductive pad is disposed on the second insulating layer and may have a second aperture exposing a portion of the second insulating layer. A through hole with a width narrower than a width of the first aperture and narrower than a width of the second aperture, penetrating through the first and second insulating layers, and an upper portion of the semiconductor substrate, is disposed in the first and second apertures. A through electrode is disposed in the through hole.

Another embodiment exemplarily described herein can be generally characterized as a semiconductor device including a first semiconductor chip; a second semiconductor chip disposed over the first semiconductor chip; and a conductive bonding layer disposed between the first semiconductor chip and the second semiconductor chip. Each of the first semiconductor chip and the second semiconductor chip may include a semiconductor substrate; a first insulating layer on the semiconductor substrate; a wiring layer on the first insulating layer and having a first aperture exposing a portion of the first insulating layer; a second insulating layer on an upper portion of the wiring layer and in the first aperture; a conductive pad on the second insulating layer and having a second aperture exposing a portion of the second insulating layer; a through hole extending through the second insulating layer, the first insulating layer, and an upper portion of the semiconductor substrate; and a through electrode in the through hole. The through hole may be disposed in the second and first apertures and a width of the through hole may be less than a width of the second aperture and also be less than a width of the first aperture. A top portion of the through electrode of the first semiconductor chip may be electrically connected to the bottom portion of the through electrode of the second semiconductor chip.

BRIEF DESCRIPTION OF THE DRAWINGS

The above and other features and advantages of the embodiments of the present invention will become more apparent with reference to the attached drawings in which:

FIGS. 3A through 3H are cross-sectional views illustrating a method of fabricating a semiconductor device according to an embodiment of the present invention, in which FIGS. 3A through 3F are cross-sectional views taken along a line III-III' of FIGS. 2A through 2F;

DETAILED DESCRIPTION

Exemplary embodiments of the present invention will now be described more fully with reference to the accompanying drawings. These embodiments may, however, be realized in many different forms and should not be construed as being limited to the embodiments set forth herein; rather, these embodiments are provided so that this disclosure will be thorough and complete, and will fully convey the concept of the invention to those skilled in the art. It will also be understood that when a layer is referred to as being "on" another layer or substrate, it can be directly on the other layer or substrate, or intervening layers may also be present.

Figure 1:
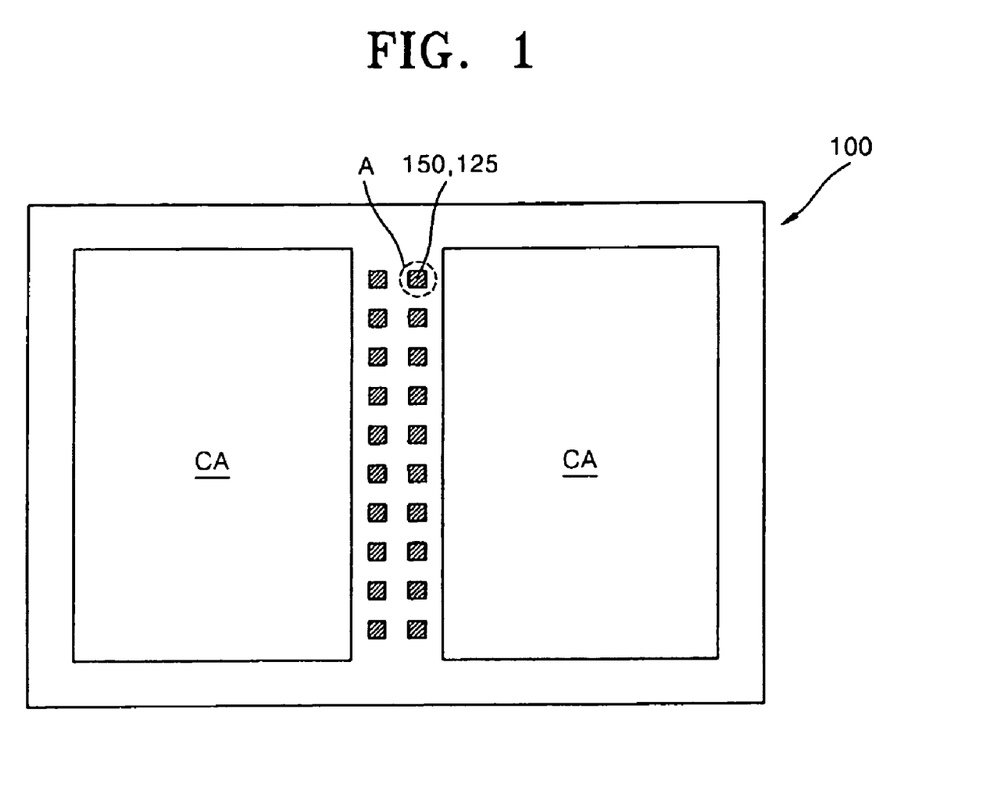
FIG. 1 is a plan view illustrating a semiconductor device according to an embodiment of the present invention.

FIG. 1 is a plan view illustrating a semiconductor device according to an embodiment of the present invention.

Referring to FIG. 1, a semiconductor device 100 may be a semiconductor chip. The semiconductor chip 100 includes multiple cell array regions CA. Multiple arrayed conductive pads 125 may be located in a central region of the semiconductor chip 100, or among the cell array regions CA. Each of the through electrodes 150 may be aligned with corresponding ones of the conductive pads 125 and be disposed over the conductive pads 125.

FIGS. 2A through 2F are plan views illustrating a method of fabricating a semiconductor device according to an embodiment of the present invention, taken in region "A" of FIG. 1. FIGS. 3A through 3H are cross-sectional views illustrating a method of fabricating a semiconductor device according to an embodiment of the present invention, in which FIGS. 3A through 3F are cross-sectional views taken along a line III-III' of FIGS. 2A through 2F.

Figure 2A:
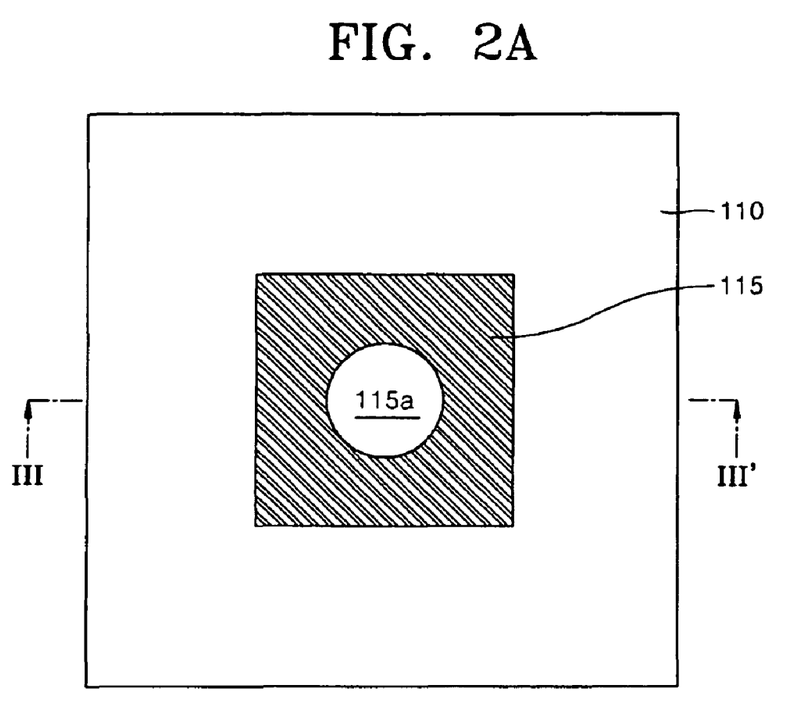
FIGS. 2A through 2F are plan views illustrating a method of fabricating a semiconductor device according to an embodiment of the present invention, taken in region "A" of FIG. 1.
Figure 3A:
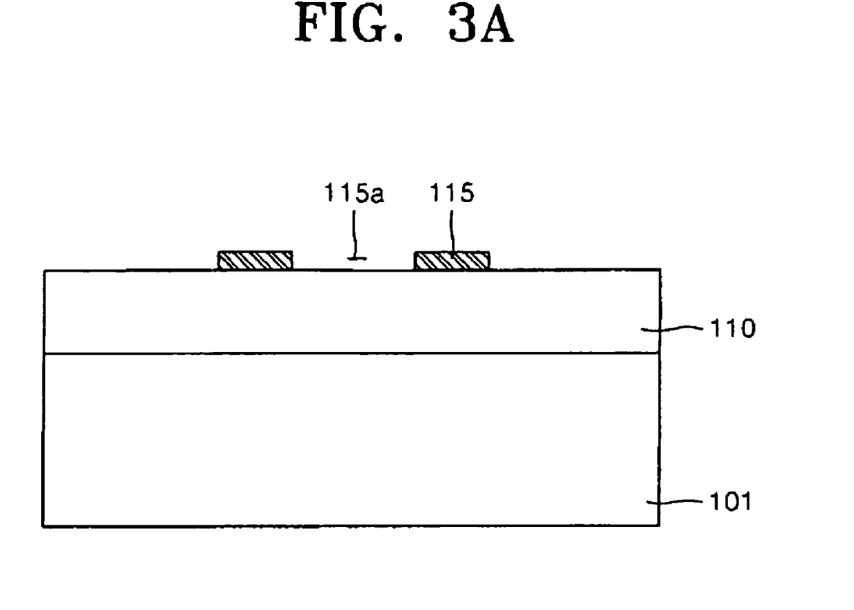

Referring to FIGS. 2A and 3A, a first insulating layer 110 is formed on a semiconductor substrate 101. Before the first insulating layer 110 is formed, elements such as transistors, capacitors, or the like, may be formed on other regions of the semiconductor substrate 101 (e.g., on the cell array region CA of FIG. 1).

A wiring layer 115 including a first aperture 115a exposing the first insulating layer 110 is formed on the first insulating layer 110. In one embodiment, the wiring layer 115 may be formed by forming a wiring conductive layer on the first insulating layer 110 followed by patterning the wiring conductive layer.

Figure 4A:
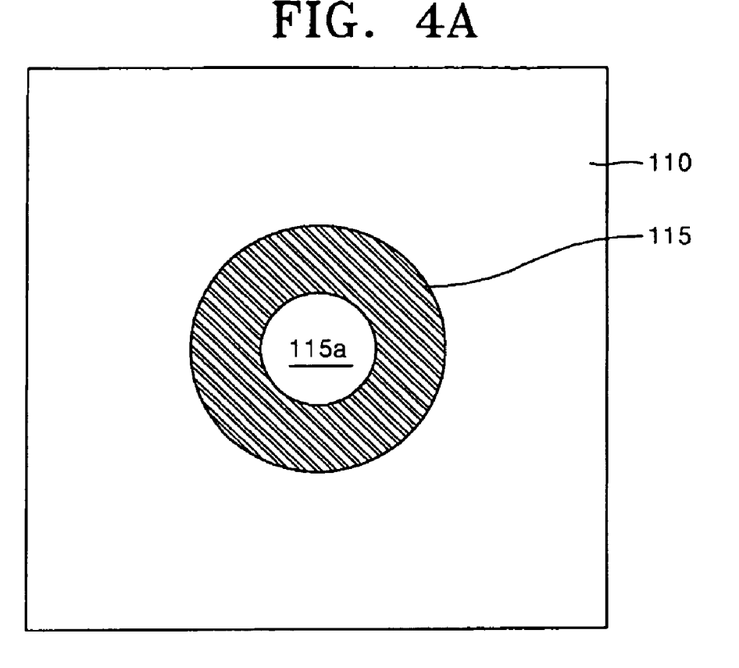
FIGS. 4A and 4B are plan views showing wiring layers according to some embodiments of the present invention.
Figure 4B:
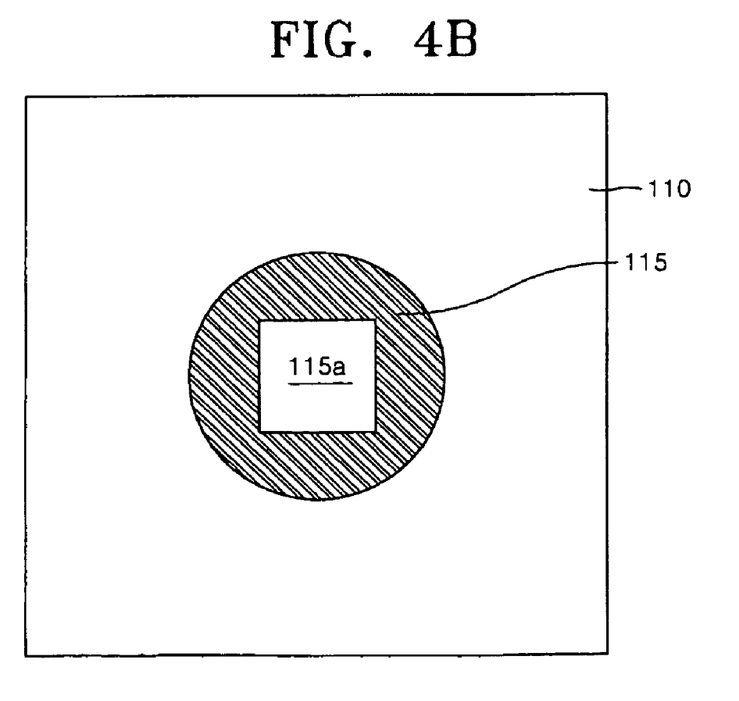

In one embodiment, the first aperture 115a may be located substantially at the center of the wiring layer 115. The wiring layer 115 may be electrically connected to elements in the cell array region CA and may include a metal such as aluminum, copper, or the like or a combination thereof. Although the wiring layer 115 is exemplarily illustrated as having a substantially rectangular shape, the wiring layer 115 may have other shapes such as a substantially circular shape, as exemplarily shown in FIGS. 4A and 4B. Although the first aperture 115a is exemplarily illustrated as having a substantially circular shape, the first aperture 115a may have other shapes such as a substantially rectangular shape, as exemplarily shown in FIG. 4B.

Figure 2B:
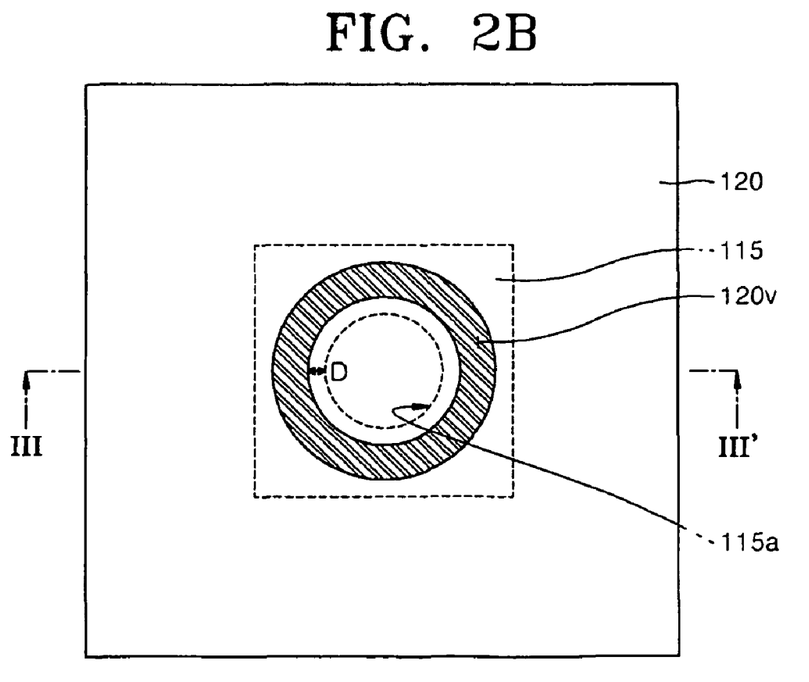
Figure 3B:
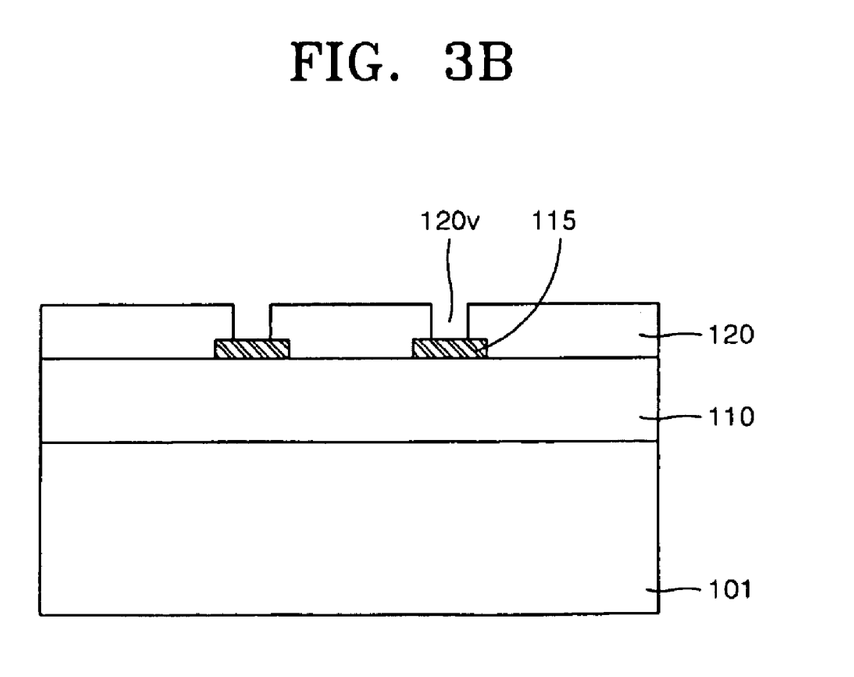

Referring to FIGS. 2B and 3B, a second insulating layer 120 is formed on the wiring layer 115. The second insulating layer 120 is also formed within the first aperture 115a and may contact sidewalls of the wiring layer 115 that define the first aperture 115a.

The second insulating layer 120 may include a material that is the same as, or substantially the same as, the material from which the first insulating layer 110 is formed. For example, the second insulating layer 120 and the first insulating layer 110 may include a silicon oxide material.

Figure 5:
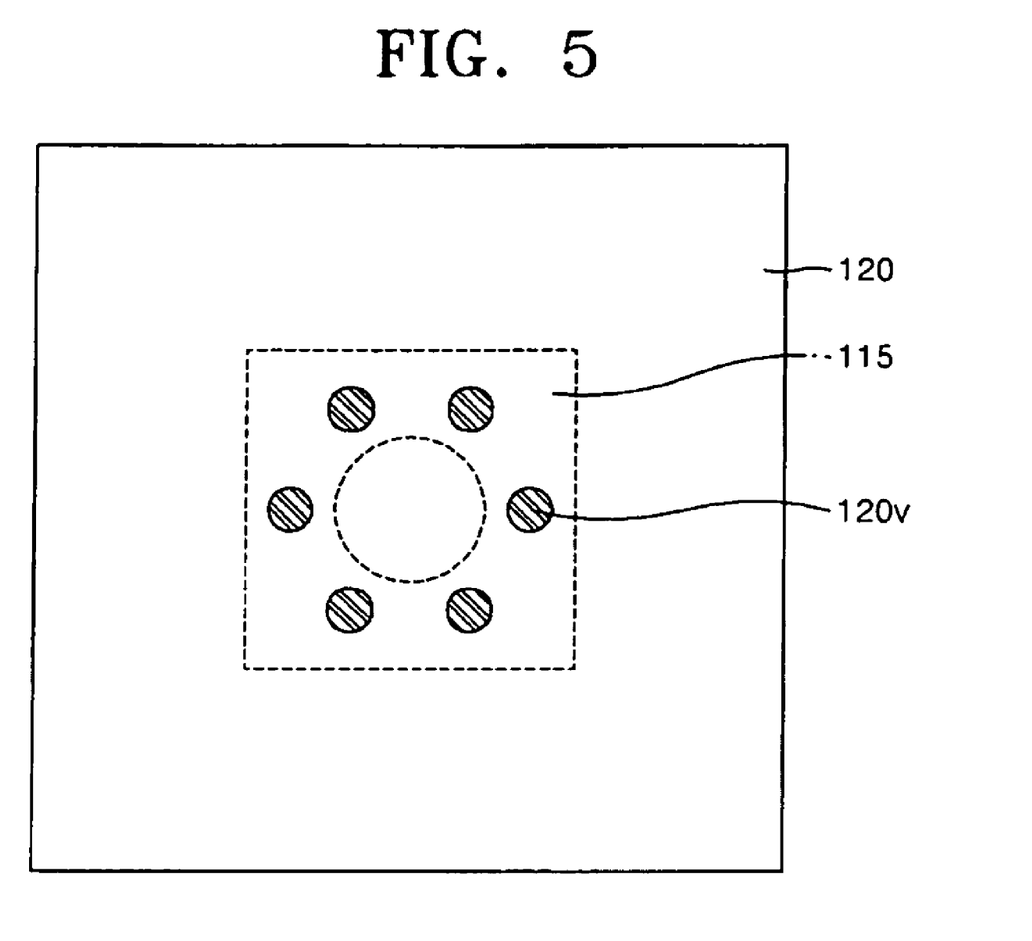
FIG. 5 is a plan view showing a via hole according to an embodiment of the present invention.

A first via hole 120v may be formed in the second insulating layer 120 to expose a portion of the wiring layer 115. The first via hole 120v may surround the first aperture 115a while being spaced apart by a predetermined distance "D" from the sidewalls of the wiring layer 115 defining the first aperture 115a. However, the first via hole 120v is not limited to the configuration described above. For example, multiple first via holes 120v exposing various parts of the wiring layer 115 may be formed as exemplarily shown in FIG. 5. As also exemplarily shown in FIG. 5, the multiple first via holes 120v may be spaced apart by the predetermined distance "D" from the sidewalls of the wiring layer 115 defining the first aperture 115a. As exemplarily shown in FIG. 5, the multiple first via holes 120v may be arranged so as to be substantially uniformly spaced apart from each other by the second insulating layer 120 around the perimeter of the first aperture 115a. It will be appreciated, however, that the number and arrangement of the multiple first via holes 120v may be varied as desired.

Figure 2C:
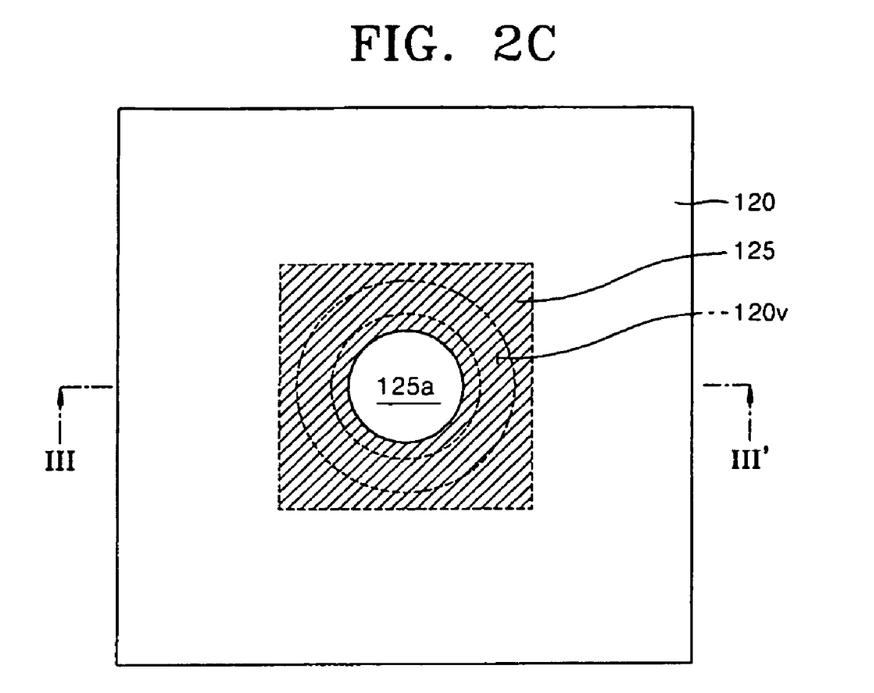
Figure 3C:
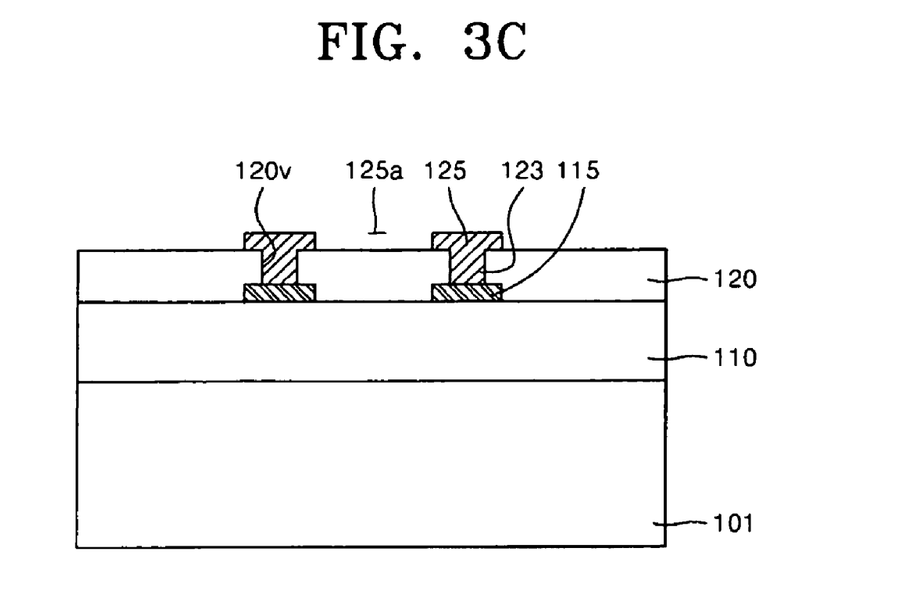

Referring to FIGS. 2C and 3C, a conductive pad 125 including a second aperture 125a to expose the second insulating layer 120 is formed on the second insulating layer 120. In one embodiment, the conductive pad 125 having the second aperture 125a may be formed by forming a pad conductive layer onto the second insulating layer 120 followed by patterning the pad conductive layer. The conductive pad 125 may include a metal such as gold, silver, copper, platinum, aluminum, or the like, an alloy of at least two of these materials, or a combination thereof.

The second aperture 125a may be formed substantially at the center of the conductive pad 125. The conductive pad 125 may be formed at a location substantially corresponding to the location of the wiring layer 115 over the first insulating layer 110. In one embodiment, the conductive pad 125 may be formed in substantially the same shape and size as the wiring layer 115. The second aperture 125a may be formed at a location substantially corresponding to the location of the first aperture 115a over the first insulating layer 110. In one embodiment, the second aperture 125a may be formed in substantially the same shape and size as the first aperture 115a.

After the first via hole 120v is formed, the pad conductive layer may be formed in the first via hole 120v. In the illustrated embodiment, a first connecting electrode 123 may be formed to electrically connect the conductive pad 125 and the wiring layer 115 through the second insulating layer 120, beneath the conductive pad 125. The conductive pad 125 may be electrically connected to elements in the cell array region CA through first connecting electrode 123 and the wiring layer 115.

The conductive pad 125 overlaps the wiring layer 115. Accordingly, the area over the semiconductor substrate 101 occupied by the conductive pad 125 and the wiring layer 115 can be minimized. As a result, integration of structures within the semiconductor device 100 may be increased.

Figure 2D:
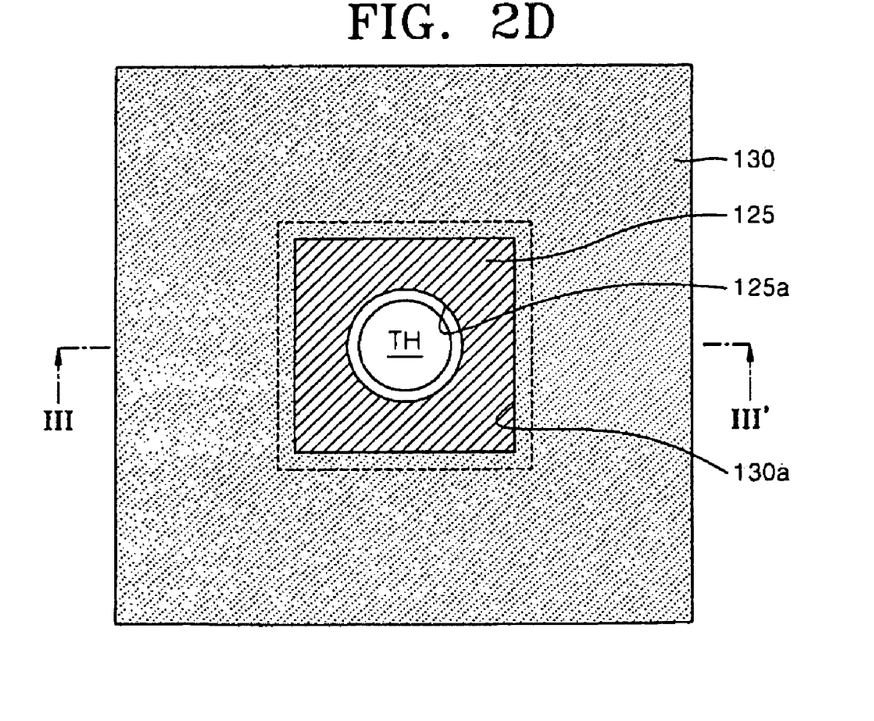
Figure 3D:
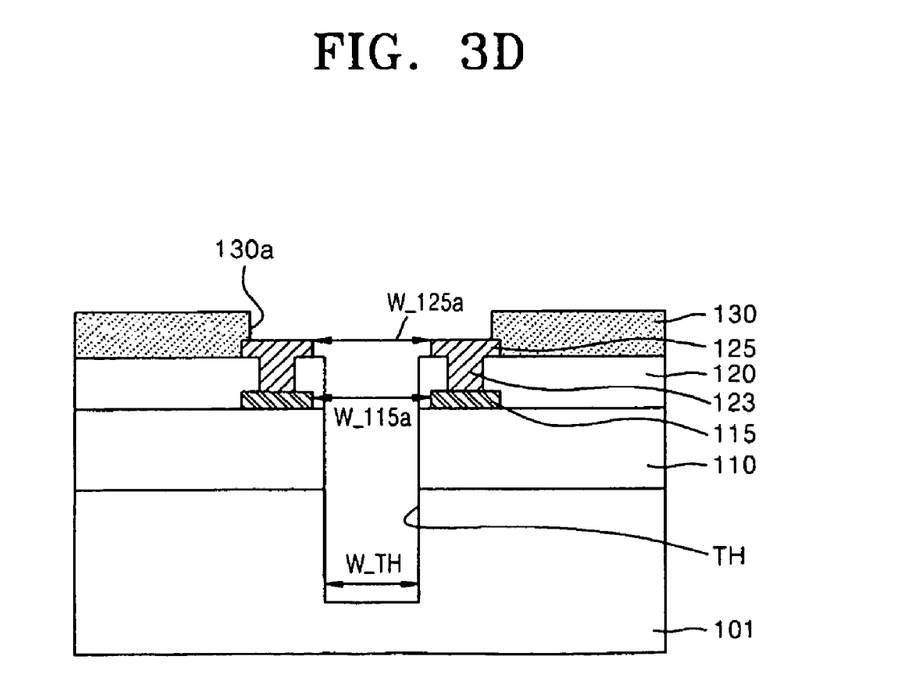

Referring to FIGS. 2D and 3D, a passivation layer 130 may be formed on the conductive pad 125 and on the second insulating layer 120 exposed by the conductive pad 125. The passivation layer 130 may include a material such as silicon nitride, polyimide, or the like or a combination thereof. A third aperture 130a is formed in the passivation layer 130. The conductive pad 125 and the second insulating layer 120 exposed by the second aperture 125a may be exposed by the third aperture 130a.

Then, a through hole TH is formed through the second insulating layer 120 exposed by the second aperture 125a, the first insulating layer 110, and the upper portion of the semiconductor substrate 101. The through hole TH is located in the second aperture 125a and in the first aperture 115a and has a width W_TH that is less than the width of the second aperture W_125a and that is also less than the width of the first aperture W_115a.

The through hole TH may be formed using a laser drill method, a photolithography method, or the like or a combination thereof. In an exemplary photolithography method, a photo-resist pattern (not shown) is formed on the conductive pad 125 and the passivation layer 130 and dry-etching is performed using the photo-resist pattern as a mask to etch the second insulating layer 120, the first insulating layer 110, and an upper portion of the semiconductor substrate 101, thereby forming the through hole TH. The dry-etching may be performed using a reactive ion etching (RIE) technique.

By forming the first aperture 115a and the second aperture 125a in the wiring layer 115 and the conductive pad 125, respectively, and by forming the through hole TH having the width W_TH in the first aperture 115a and the second aperture 125a, it is possible to form the through hole TH by etching only the insulating layers 120 and 110, and the semiconductor substrate 101. Thus, the overall process used to form the through hole TH is simplified because the through hole TH may be formed without etching metal layers such as the wiring layer 115 and the conductive pad 125.

Since materials that are etched to form the upper portion of the through hole TH are the insulating layers 120 and 110, etching speeds of the insulating layers 120 and 110 are substantially equal. Thus, sidewalls of the through hole TH may be smooth (i.e., substantially flat) from the second insulating layer 120 to the first insulating layer 110. Accordingly, there may be substantially no step difference on the sidewalls of the through hole TH from the second insulating layer 120 to the first insulating layer 110. Such an effect may occur more easily in cases where the insulating layers 120 and 110 are layers formed of the same materials.

Figure 2E:
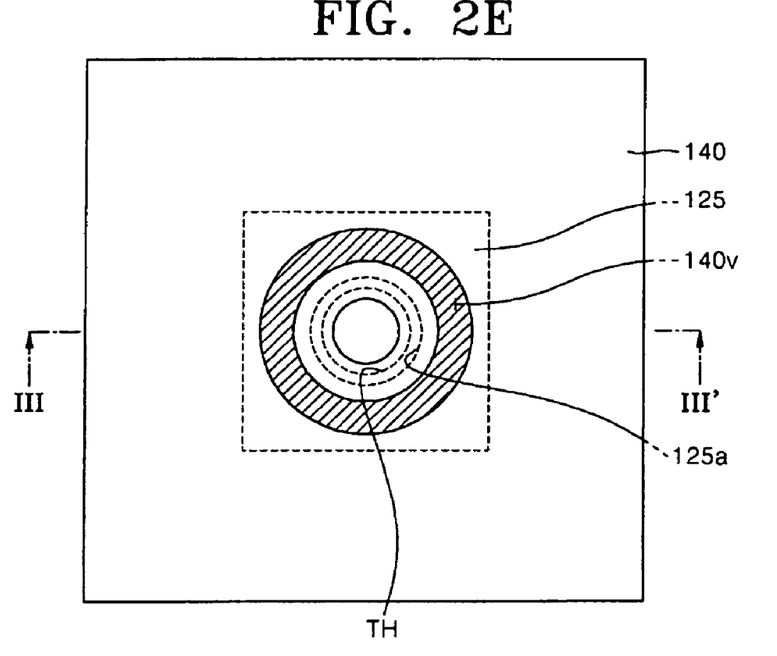
Figure 3E:
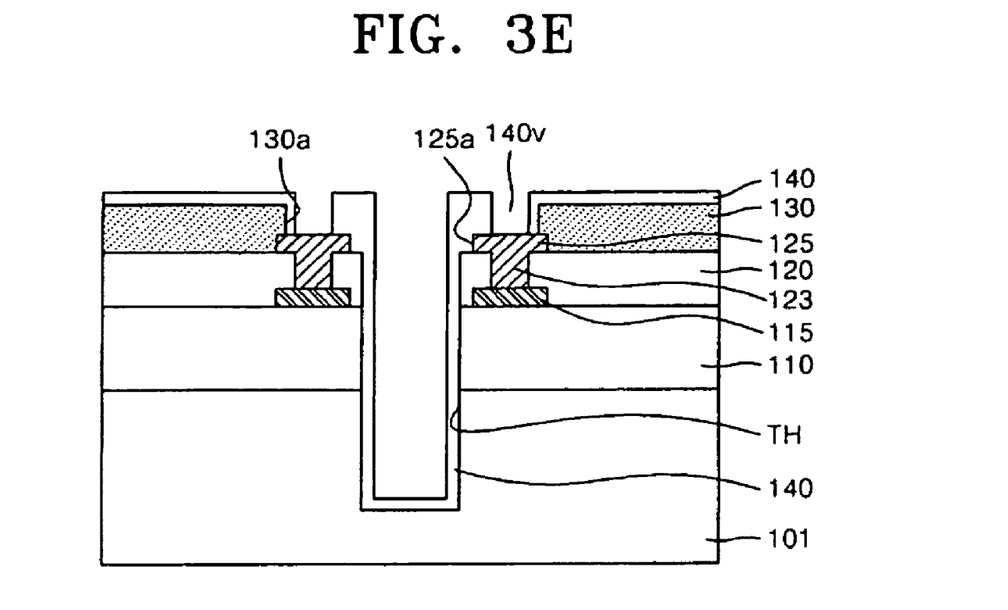

Referring to FIGS. 2E and 3E, a third insulating layer 140 may be formed on the semiconductor substrate 101 where the through hole TH has been formed. The third insulating layer 140 may be formed on an upper portion of the passivation layer 130, an upper portion of the conductive pad 125, and the sidewalls of the through hole TH. The third insulating layer 140 may be formed by performing a chemical vapor deposition (CVD) method. Since the sidewalls of the through hole TH are substantially flat, the third insulating layer 140 may be conformally formed on the sidewalls of the through hole TH. Accordingly, the third insulating layer 140 may contact the sidewalls of the through hole TH contiguously from top portion to the bottom portion thereof.

A second via hole 140v may be formed in the third insulating layer 140 to expose a portion of the conductive pad 125. The second via hole 140v may surround the second aperture 125a while being spaced apart by a predetermined distance from the sidewalls of the conductive pad 125 defining the second aperture 125a. In one embodiment, the second via hole 140 may be formed to have a shape similar to that of the first via hole 120v.

Figure 2F:
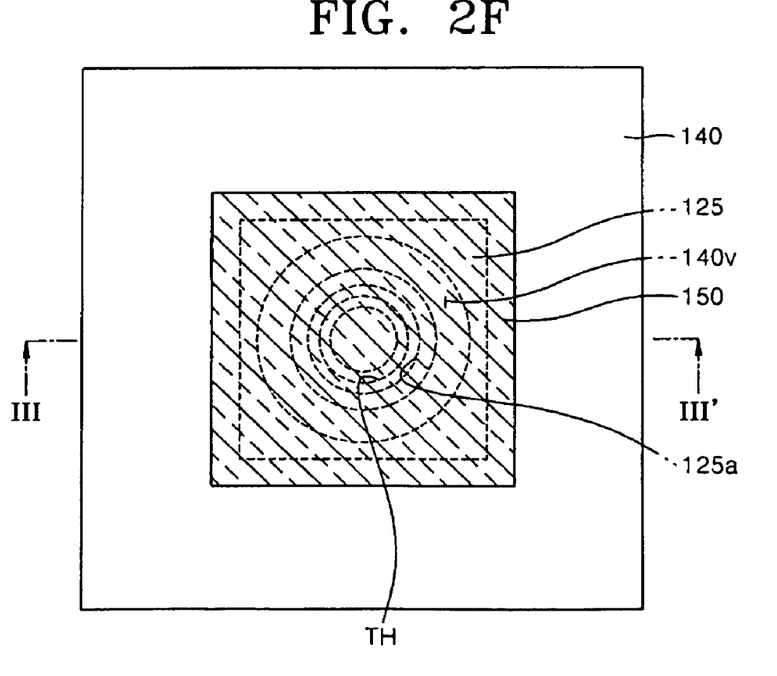
Figure 3F:
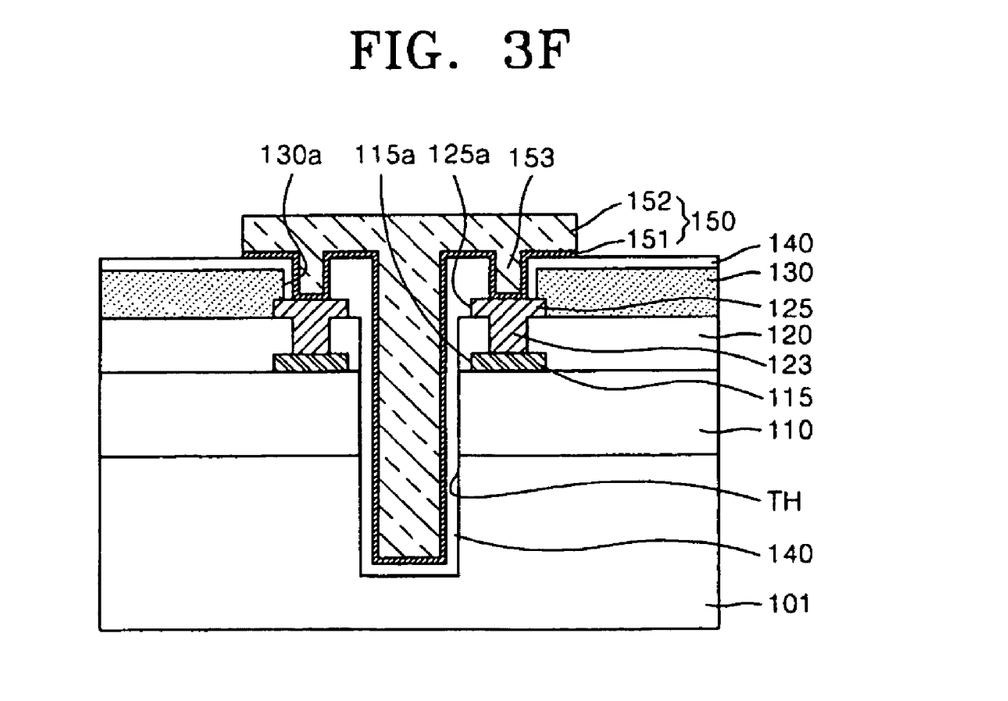

Referring to FIGS. 2F and 3F, a barrier metal layer 151 and a through electrode layer 152 are sequentially formed on the semiconductor substrate 101 where the through hole TH and the second via hole 140v are formed. Then, a through electrode 150 is formed by patterning the through electrode layer 152 and the barrier metal layer 151. The through electrode 150 is located in the through hole TH and may extend through the third insulating layer 140 as well as over an upper surface of the third insulating layer 140. The third insulating layer 140 may also surround the through electrode 150 within the through hole TH.

The barrier metal layer 151 may be formed by performing a sputtering method, a chemical vapor deposition (CVD) method, or the like or a combination thereof. The through electrode layer 152 may be formed by performing, for example, an electroplating method. In one embodiment, the through electrode layer 152 may be formed by performing the electroplating method using the barrier metal layer 151 as a seed layer. Since the sidewalls of the through hole TH are substantially flat, the barrier metal layer 151 may be conformally formed along the sidewalls of the through hole TH. Therefore, the through electrode layer 152 may substantially completely fill the through hole TH.

The barrier metal layer 151 may include Ti, TiN, TaN, WN, or the like or a combination thereof. The through electrode layer 152 may include copper, nickel, or the like or a combination thereof.

After the second via hole 140v is formed, the through electrode 150 may be formed in the second via hole 140v. In the illustrated embodiment, a second connecting electrode 153, electrically connecting the through electrode 150 and the conductive pad 125 while passing through the third insulating layer 140, may be formed below a portion of the through electrode 150 extending over the third insulating layer 140. The through electrode 150 may be electrically connected to the conductive pad 125, the first connecting electrode 123, and the wiring layer 115 to elements in the cell array region CA, via the second connecting electrode 153.

The through electrode 150 overlaps the conductive pad 125 and the wiring layer 115. Accordingly, the area over the semiconductor substrate 101 occupied by the through electrode 150, the conductive pad 125 and the wiring layer 115 can be minimized. As a result, integration of structures within the semiconductor device 100 may be increased. Such integration is significantly increased in comparison to the conventional configurations where a through electrode and a conductive pad are electrically connected using another unit after the through electrode is formed elsewhere on the substrate, separately from the conductive pad. Also, the length of the electrical path connecting the through electrode 150 and the conductive pad 125 may be minimized.

Figure 3G:
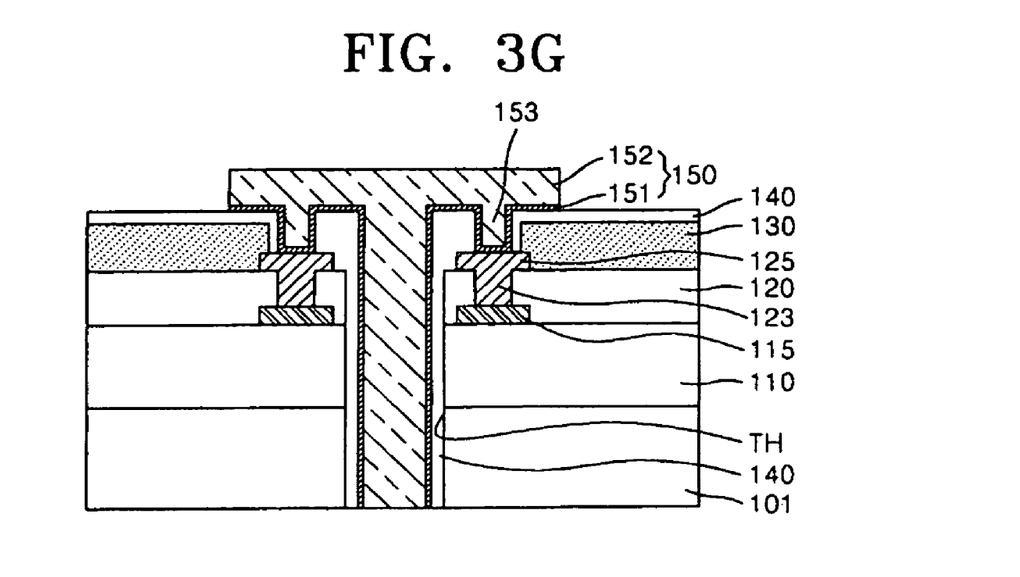

Referring to FIG. 3G, the bottom surface of the semiconductor substrate 101 is removed (e.g., polished) until a bottom portion of the through electrode 150 is exposed through the semiconductor substrate 101. In one embodiment, the bottom portion of the through electrode 150 may be polished.

Figure 3H:
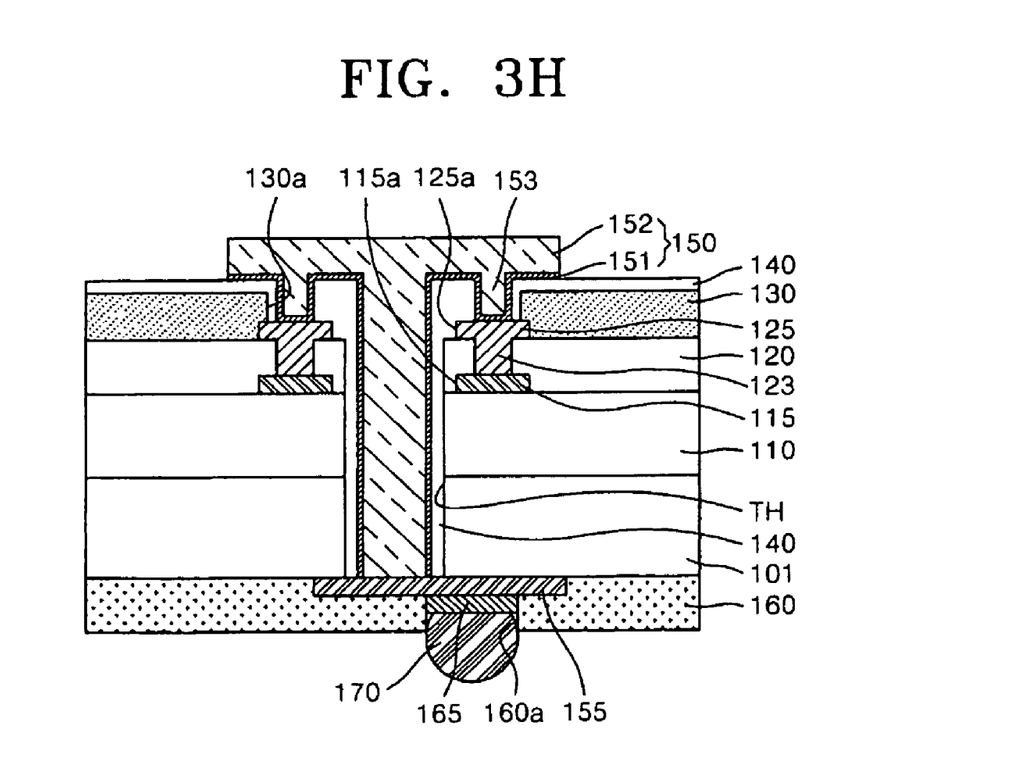

Referring to FIG. 3H, a re-wiring layer 155 may be formed on the bottom portion of the through electrode 150 exposed through the semiconductor substrate 101. A protective layer 160 having a fourth aperture 160a partially exposing the re-wiring layer 155 formed therein may also be formed on the re-wiring layer 155. A bonding pad 165 may be formed on the re-wiring layer 155 exposed via the fourth aperture 160a. A conductive bump 170 or the like (e.g., a solder ball) may be formed on the bonding pad 165.

Figure 6:
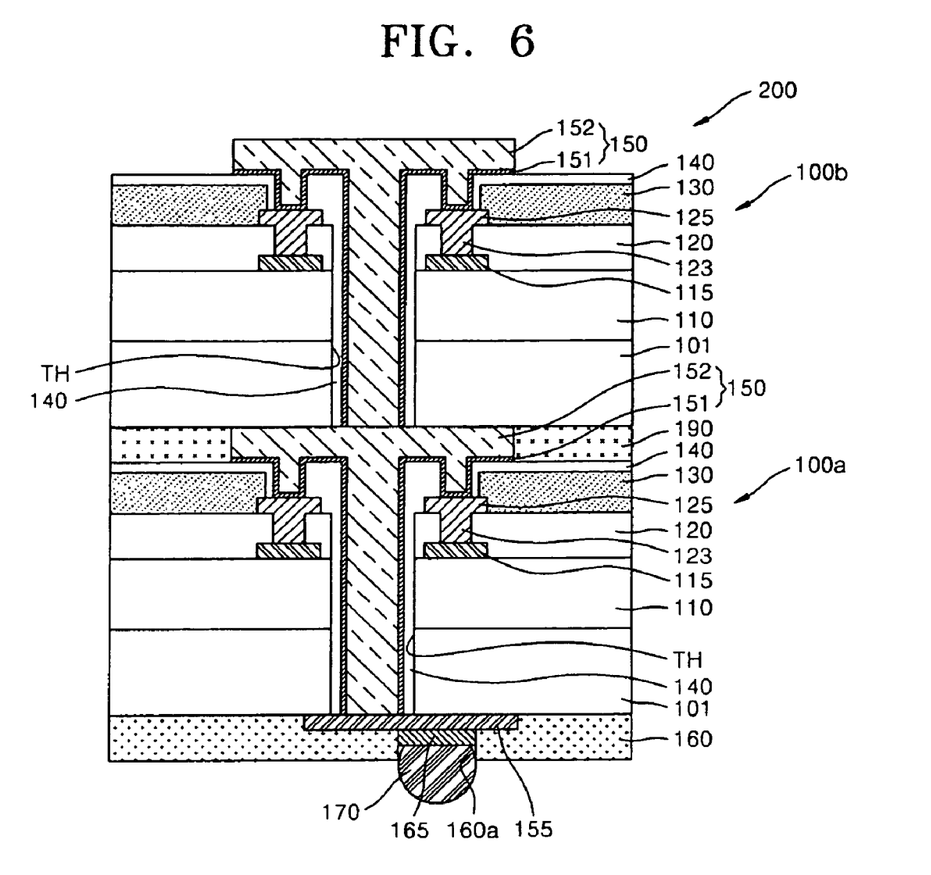
FIG. 6 is a cross-sectional view partially showing a semiconductor package according to an embodiment of the present invention.

FIG. 6 is a cross-sectional view partially showing a semiconductor package according to an embodiment of the present invention.

Referring to FIG. 6, a semiconductor package 200 is illustrated. In one embodiment, the semiconductor package 200 may include the semiconductor chip described with reference to FIG. 3G (i.e., the upper semiconductor chip 100b) vertically stacked on the semiconductor chip described with reference to FIG. 3H (i.e., the lower semiconductor chip 100a) using a conductive bonding layer 190. As exemplarily illustrated, the through electrode 150 of the upper semiconductor chip 100b is electrically connected to the through electrode 150 of a lower semiconductor chip 100a. According to other embodiments, a semiconductor package may be formed by sequentially stacking semiconductor chips described with reference to either FIG. 3H or 3G.

Embodiments of the present invention may be practiced in many ways. What follows is a non-limiting description of some embodiments of the present invention.

According to one embodiment, a method of fabricating a semiconductor device may include forming a first insulating layer on a semiconductor substrate; forming a wiring layer on the first insulating layer, wherein the wiring layer may have a first aperture exposing a portion of the first insulating layer; forming a second insulating layer on the wiring layer and in the first aperture; forming a conductive pad on the second insulating layer, wherein the conductive pad may have a second aperture exposing a portion of the second insulating layer; forming a through hole extending through the second insulating layer, the first insulating layer, and an upper portion of the semiconductor substrate, wherein the through hole may be formed in the second and first apertures wherein a width of the through hole may be less than widths of the second and first apertures; and forming a through electrode in the through hole.

According to the aforementioned method a first via hole exposing the wiring layer in the second insulating layer may be formed before forming the conductive pad.

According to the aforementioned method a passivation layer having a third aperture to expose the conductive pad and second insulating layer exposed within the second aperture may be formed before forming the through hole.

In one embodiment, the aforementioned method may further include, before forming the through electrode: forming a third insulating layer on the conductive pad and sidewalls of the through hole; and forming a second via hole in the third insulating layer to expose the conductive pad.

In one embodiment, the through electrode may be formed by electroplating.

In one embodiment, the first and second insulating layers may include substantially the same material. In another embodiment, the first and the second insulating layers may include silicon oxide.

According to another embodiment, a semiconductor device may include a semiconductor substrate; a first insulating layer on the semiconductor substrate; a wiring layer on the first insulating layer, wherein the wiring layer may have a first aperture exposing a portion of the first insulating layer; a second insulating layer on an upper portion of the wiring layer and in the first aperture; a conductive pad on the second insulating layer, wherein the conductive pad may have a second aperture exposing a portion of the second insulating layer; a through hole extending through the second insulating layer, the first insulating layer, and an upper portion of the semiconductor substrate, wherein the through hole may be disposed in the second and first apertures and wherein a width of the through hole is less than widths of the second and first apertures; and a through electrode in the through hole.

In one embodiment, the aforementioned semiconductor device may further include a first connecting electrode connected to the wiring layer through the second insulating layer, wherein the first connecting electrode may be below the conductive pad.

In one embodiment, the aforementioned semiconductor device may further include a third insulating layer on an upper portion of the conductive pad and the sidewalls of the through hole, wherein the third insulating layer may surround the through electrode in the through hole and wherein the through electrode may extend over an upper surface of the third insulating layer; and a second connecting electrode connected to the conductive pad through the third insulating layer, wherein the second connecting electrode may be below a portion of the through hole extending over the upper surface of the third insulating layer.

In one embodiment, the first and second insulating layers may include substantially the same material. In another embodiment, the first and the second insulating layers may include silicon oxide.

In one embodiment, substantially no step difference exists on sidewalls of the through hole between the second insulating layer and the first insulating layer.

In one embodiment, the wiring layer has a substantially circular shape when viewed in plan view.

In one embodiment, the wiring layer has a substantially rectangular shape when viewed in plan view.

In one embodiment, the first aperture has a substantially circular shape when viewed in plan view.

In one embodiment, the first aperture has a substantially rectangular shape when viewed in plan view.

In one embodiment, the aforementioned semiconductor device may further include a plurality of first connecting electrodes below the conductive pad and connected to the wiring layer through the second insulating layer, wherein the plurality of first connecting electrodes are spaced apart from each other by the second insulating layer.

According to another embodiment, a semiconductor device may include a first semiconductor chip; a second semiconductor chip disposed over the first semiconductor chip; and a conductive bonding layer disposed between the first semiconductor chip and the second semiconductor chip. Each of the first semiconductor chip and the second semiconductor chip may include a semiconductor substrate; a first insulating layer on the semiconductor substrate; a wiring layer on the first insulating layer and having a first aperture exposing a portion of the first insulating layer; a second insulating layer on an upper portion of the wiring layer and in the first aperture; a conductive pad on the second insulating layer and having a second aperture exposing a portion of the second insulating layer; a through hole extending through the second insulating layer, the first insulating layer, and an upper portion of the semiconductor substrate; and a through electrode in the through hole. The through hole may be disposed in the second and first apertures and a width of the through hole may be less than a width of the second aperture and also be less than a width of the first aperture. A top portion of the through electrode of the first semiconductor chip may be electrically connected to the bottom portion of the through electrode of the second semiconductor chip.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device, comprising:
   a semiconductor substrate;
   a first insulating layer on the semiconductor substrate;
   a wiring layer on the first insulating layer, the wiring layer having a first aperture exposing a portion of the first insulating layer;
   a second insulating layer on an upper portion of the wiring layer and in a portion of the first aperture;
   a conductive pad on the second insulating layer, the conductive pad having a second aperture exposing a portion of the second insulating layer;
   a through hole extending through the second insulating layer, the first insulating layer, and an upper portion of the semiconductor substrate, wherein the through hole is disposed in the second and first apertures and wherein a width of the through hole is less than a width of the second aperture and is less than a width of the first aperture; and
   a through electrode in the through hole.

2. The semiconductor device of claim 1, further comprising a first connecting electrode connected to the wiring layer through the second insulating layer, wherein the first connecting electrode is disposed below the conductive pad.

3. The semiconductor device of claim 1, further comprising:
   a third insulating layer on an upper portion of the conductive pad and on the sidewalls of the through hole, wherein the third insulating layer surrounds the through electrode in the through hole and wherein the through electrode extends over an upper surface of the third insulating layer; and
   a second connecting electrode connected to the conductive pad through the third insulating layer, wherein the second connecting electrode is disposed below a portion of the through hole extending over the upper surface of the third insulating layer.

4. The semiconductor device of claim 1, wherein the first and second insulating layers comprise substantially the same material.

5. The semiconductor device of claim 4, wherein the first and second insulating layers comprise silicon oxide.

6. The semiconductor device of claim 1, wherein substantially no step difference exists on sidewalls of the through hole between the second insulating layer and the first insulating layer.

7. The semiconductor device of claim 1, wherein the wiring layer has a substantially circular shape when viewed in plan view.

8. The semiconductor device of claim 1, wherein the wiring layer has a substantially rectangular shape when viewed in plan view.

9. The semiconductor device of claim 1, wherein the first aperture has a substantially circular shape when viewed in plan view.

10. The semiconductor device of claim 1, wherein the first aperture has a substantially rectangular shape when viewed in plan view.

11. The semiconductor device of claim 1, further comprising a plurality of first connecting electrodes below the conductive pad and connected to the wiring layer through the second insulating layer, wherein the plurality of first connecting electrodes are spaced apart from each other by the second insulating layer.

12. A semiconductor device, comprising:

a first semiconductor chip;

a second semiconductor chip disposed over the first semiconductor chip; and a conductive bonding layer disposed between the first semiconductor chip and the second semiconductor chip, wherein each of the first semiconductor chip and the second semiconductor chip comprise:

a semiconductor substrate;

a first insulating layer on the semiconductor substrate;

a wiring layer on the first insulating layer, the wiring layer having a first aperture exposing a portion of the first insulating layer;

a second insulating layer on an upper portion of the wiring layer and in a portion of the first aperture;

a conductive pad on the second insulating layer, the conductive pad having a second aperture exposing a portion of the second insulating layer;

a through hole extending through the second insulating layer, the first insulating layer, and an upper portion of the semiconductor substrate, wherein the through hole is disposed in the second and first apertures and wherein a width of the through hole is less than a width of the second aperture and is less than a width of the first aperture; and a through electrode in the through hole, wherein a top portion of the through electrode of the first semiconductor chip is electrically connected to a bottom portion of the through electrode of the second semiconductor chip.

* * * * *